(12) United States Patent  
Malek et al.

(10) Patent No.: US 9,192,057 B2  
(45) Date of Patent: Nov. 17, 2015

(54) ELECTROMAGNETIC INTERFERENCE SHIELDING STRUCTURES

(71) Applicant: Apple Inc., Cupertino, CA (US)

(72) Inventors: Shayan Malek, San Jose, CA (US); Gregory N. Stephens, Sunnyvale, CA (US); Michael B. Wittenberg, Sunnyvale, CA (US); Jared M. Kole, San Jose, CA (US); Warren Z. Jones, San Jose, CA (US)

(73) Assignee: Apple Inc., Cupertino, CA (US)

( * ) Notice: Subject to any disclaimer, the term of this patent is extended or adjusted under 35 U.S.C. 154(b) by 370 days.

(21) Appl. No.: 13/726,890

(22) Filed: Dec. 26, 2012

(65) Prior Publication Data

US 2014/0177181 A1    Jun. 26, 2014

(51) Int. Cl.
*H05K 1/00* (2006.01)
*H05K 3/30* (2006.01)
*H05K 9/00* (2006.01)

(52) U.S. Cl.
CPC ............ *H05K 3/30* (2013.01); *H05K 9/003* (2013.01); *H05K 2201/09063* (2013.01); *H05K 2201/10371* (2013.01); *H05K 2201/10409* (2013.01); *Y10T 29/4913* (2015.01); *Y10T 29/49117* (2015.01)

(58) Field of Classification Search
USPC .......................................... 361/749, 752, 757
See application file for complete search history.

(56) References Cited

U.S. PATENT DOCUMENTS

| | | |
|---|---|---|
| 8,213,660 B2 | 7/2012 | Phillips |
| 8,457,333 B2 | 6/2013 | Yeates et al. |
| 8,494,207 B2 | 7/2013 | Lin et al. |
| 2011/0049221 A1* | 3/2011 | Blais et al. .................. 228/179.1 |
| 2012/0148081 A1* | 6/2012 | Yeates et al. .................. 381/345 |
| 2013/0058059 A1 | 3/2013 | Min et al. |
| 2013/0113088 A1 | 5/2013 | Zhao et al. |

* cited by examiner

*Primary Examiner* — Andargie M Aychillhum

(74) *Attorney, Agent, or Firm* — Treyz Law Group; G. Victor Treyz; Joseph F. Guihan

(57) ABSTRACT

Electrical components are mounted on a printed circuit in an electronic device housing. Shielding can structures may include a sheet metal shield can layer with a conductive gasket. The printed circuit may have an opening. A screw passes through the opening in the printed circuit and openings in the conductive gasket and sheet metal shield can layer to secure the shielding can structures to the housing. When secured, a lip in the gasket lies between the printed circuit substrate and the housing. The gasket may be formed from conductive elastomeric material. A shield can lid and a flexible printed circuit may be embedded within conductive elastomeric material that provides a thermal conduction path to dissipate heat from electrical components under the lid. Shield can members that are located on opposing sides of a bend in a flexible printed circuit substrate may be coupled by a conductive elastomeric bridging structure.

32 Claims, 20 Drawing Sheets

ELECTROMAGNETIC INTERFERENCE SHIELDING STRUCTURES

BACKGROUND

This relates generally to electronic devices and, more particularly, to electronic devices with electromagnetic interference shielding structures.

Electronic devices include electrical components. Components such as integrated circuits have the potential to emit electromagnetic interference and have the potential to be disrupted by the presence of electromagnetic interference from nearby components. To reduce electromagnetic interference, components are often covered with electromagnetic shielding cans formed from one or more metal parts. The shielding cans enclose components on a printed circuit board so that the cans do not emit harmful electromagnetic interference signals and are isolated from interference from nearby components.

Challenges can arise when mounting shielding cans in electronic devices. In some designs, insufficient room is available to mount a conventional shielding can. In other designs, signal paths may not be well secured or grounded to shielding cans or the components within a shielding can may be thermally isolated from surrounding structures. Conventional shielding can arrangements may also be unable to accommodate substrates mounted on non-planar surfaces.

It would therefore be desirable to be able to provide improved shielding arrangements for electronic components in electronic devices.

SUMMARY

An electronic device may have a housing such as a metal housing with a protrusion. The protrusion may be a screw boss with a threaded opening.

Electrical components may be mounted on a substrate in the housing. The substrate may be a printed circuit substrate such as a flexible printed circuit or rigid printed circuit board.

Shielding can structures may shield the electrical components from electromagnetic signal interference. The shielding can structures may be formed from metal parts such as a base and a lid attached to the base, metal members stamped from sheet metal, and other conductive shielding structures.

The shielding can structures may include metal shielding can structures such as a sheet metal layer with a conductive gasket. The metal shielding can structures may have an opening. The conductive gasket may have an opening that is aligned with the opening in the metal shielding can structures. The printed circuit substrate may have an opening that is aligned with the openings in the metal shielding can structures. A screw that passes through the opening in the printed circuit and the openings in the conductive gasket and metal shielding can structures may secure the shielding can structures to the housing so that a lip in the gasket lies between the printed circuit substrate and the housing. The gasket may be formed from conductive elastomeric material such as plastic with conductive filler that is molded over the metal shielding can structures around the opening in the metal shielding can structures or may be formed from a material such as metal.

Shielding can structures may include metal shielding can structures such as a metal lid and a metal base. The metal lid and a flexible printed circuit may be embedded within conductive elastomeric material that covers at least some of the flexile printed circuit and metal lid. The conductive elastomeric material may contact electrical components on the substrate under the lid, thereby forming a thermal path to dissipate heat from the electrical components. Traces on the flexible printed circuit may be shorted to the metal lid.

Shield can members that are located on opposing sides of a bend in a flexible printed circuit substrate may be coupled by a conductive elastomeric bridging structure. The conductive elastomeric bridging structure may be plastic with a conductive filler that is molded to the shield can members.

Further features, their nature and various advantages will be more apparent from the accompanying drawings and the following detailed description of the preferred embodiments.

DETAILED DESCRIPTION

Figure 1:
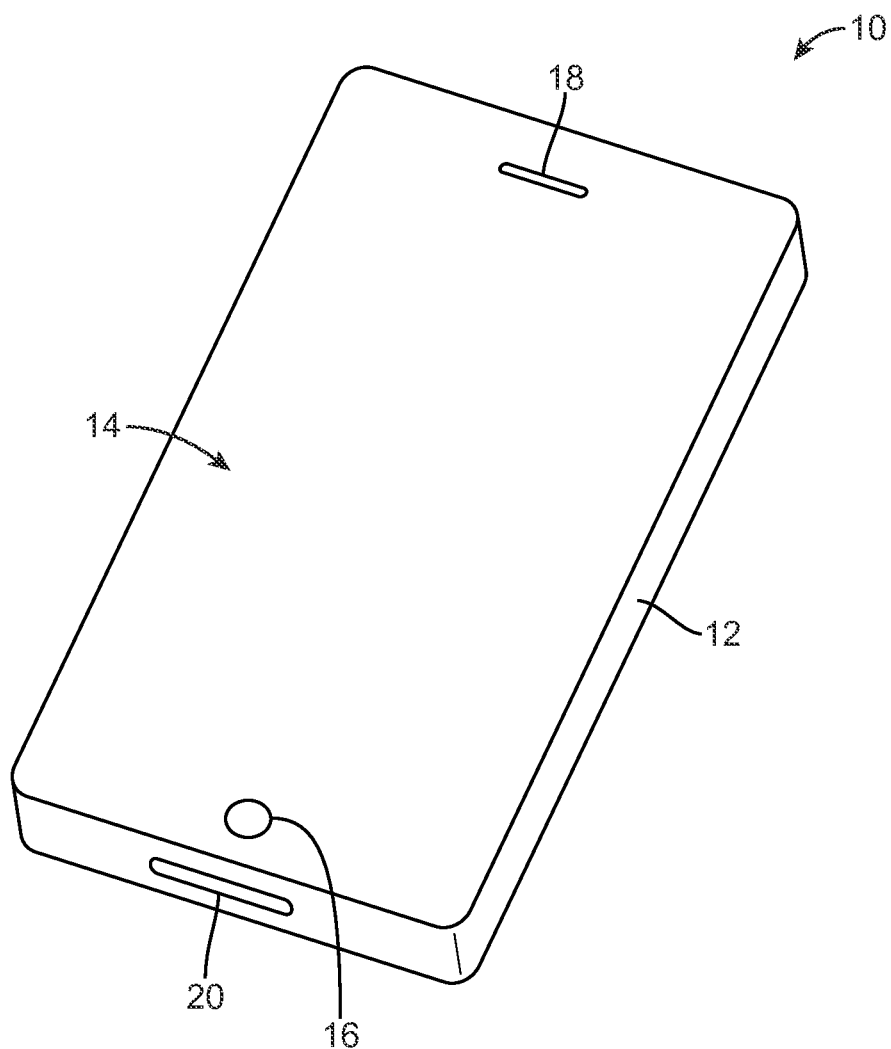
FIG. 1 is a perspective view of an illustrative electronic device of the type that may be provided with electrical component shielding structures in accordance with an embodiment.

An illustrative electronic device that may be provided with electromagnetic interference shielding structures for shielding electrical components mounted on dielectric substrates such as printed circuits is shown in FIG. 1. Electronic devices such as device 10 of FIG. 1 may be cellular telephones, media players, other handheld portable devices, somewhat smaller portable devices such as wrist-watch devices, pendant devices, or other wearable or miniature devices, gaming equipment, tablet computers, notebook computers, desktop computers, televisions, computer monitors, computers integrated into computer displays, or other electronic equipment.

In the example of FIG. 1, device 10 includes a display such as display 14. Display 14 has been mounted in a housing such as housing 12. Housing 12, which may sometimes be referred to as an enclosure or case, may be formed of plastic, glass, ceramics, fiber composites, metal (e.g., stainless steel, aluminum, etc.), other suitable materials, or a combination of any two or more of these materials. Housing 12 may be formed using a unibody configuration in which some or all of housing 12 is machined or molded as a single structure or may be formed using multiple structures (e.g., an internal frame structure, one or more structures that form exterior housing surfaces, etc.).

Display 14 may be a touch screen display that incorporates a layer of conductive capacitive touch sensor electrodes or other touch sensor components (e.g., resistive touch sensor components, acoustic touch sensor components, force-based touch sensor components, light-based touch sensor components, etc.) or may be a display that is not touch-sensitive. Capacitive touch screen electrodes may be formed from an array of indium tin oxide pads or other transparent conductive structures.

Display 14 may include an array of display pixels formed from liquid crystal display (LCD) components, an array of electrophoretic display pixels, an array of plasma display pixels, an array of organic light-emitting diode display pixels, an array of electrowetting display pixels, or display pixels based on other display technologies.

Display 14 may be protected using a display cover layer such as a layer of transparent glass or clear plastic. Openings may be formed in the display cover layer. For example, an opening may be formed in the display cover layer to accommodate a button such as button 16. An opening may also be formed in the display cover layer to accommodate ports such as speaker port 18.

Housing 12 may have one or more openings to accommodate structures such as buttons, status indicators, and connector ports. Housing 12 may, for example, connector ports such as connector port 20 in housing 12. Connectors for connector ports such as connector port 20 may include audio jack connectors, power connectors, digital data port connectors (e.g., for forming a digital data port that receives digital data on digital signal lines and that receives power on power lines), a port that handles a mixture of analog signals, digital signals, and power signals, or other suitable connectors.

The components in device 10 may include radio-frequency transceiver circuitry for transmitting and receiving wireless signals using antenna structures in device 10, clock circuits, display driver circuits, processors, memory, and other electrical components. Electrical components such as these have the potential to emit electromagnetic interference and have the potential to be disrupted when exposed to electromagnetic interference emitted by nearby components. To reduce the potentially harmful effects of interference, components in device 10 may be shielded using one or more electromagnetic interference shielding cans (sometimes referred to as shields, shielding structures, radio-frequency shields, etc.).

Figure 2:
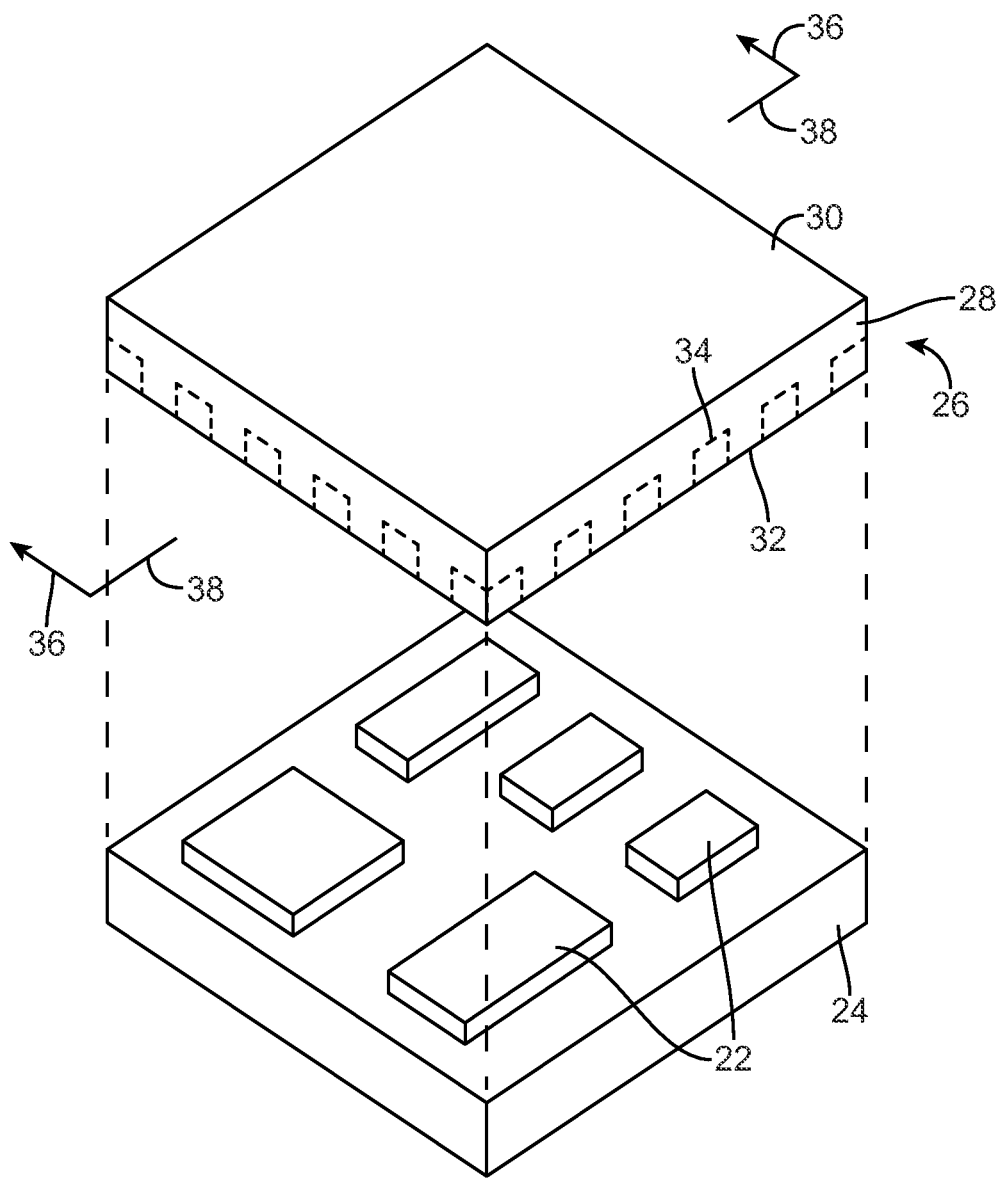
FIG. 2 is an exploded perspective view of a shielding can of the type that may be used to electromagnetically shield electronic components mounted on a printed circuit in accordance with an embodiment.

FIG. 2 is an exploded perspective view of an illustrative substrate to which components have been mounted and an associated electromagnetic shielding can. As shown in FIG. 2, electrical components 22 are mounted on substrate 24. Electrical components 22 may include processing circuitry, memory, application-specific integrated circuits, communications circuitry, radio-frequency transceiver circuitry, display control circuitry, clock circuits, and other electrical devices. Substrate 24 may be formed from a dielectric. For example, substrate 24 may be a printed circuit such as a flexible printed circuit that is formed from a flexible layer of polyimide or other flexible polymer layer or may be a rigid printed circuit board formed from a material such as fiberglass-filled epoxy. Metal traces (e.g., copper traces, aluminum traces, or traces formed from other metals) may be formed in the interior of printed circuit substrate 24 and/or on the surface of printed circuit substrate 24. These metal traces may include solder pads (contacts) to which components 22 may be attached using solder joints.

Shielding can structures such as metal shielding can structures 26 (sometimes referred to as a shield can, shielding can, metal shielding member, metal shield, etc.) may include a planar upper portion such as upper portion 30 and sidewalls such as sidewalls 28. In some situations, shielding can structures 26 may be formed from multiple portions (e.g., multiple metal members). For example, shielding can structures 26 may have a frame or other base that is covered by a separate lid. The lid may include planar upper portion 30 and, if desired, may include vertically extending portions such as vertical sidewall portions 28. Walls 28 may have straight edges such as lower edge 32 or may have notches, as shown by dashed line 34. Other types of multipart structures (e.g., other sets of two or more metal members) may be used in forming metal shielding can structures 26 if desired.

Figure 3:
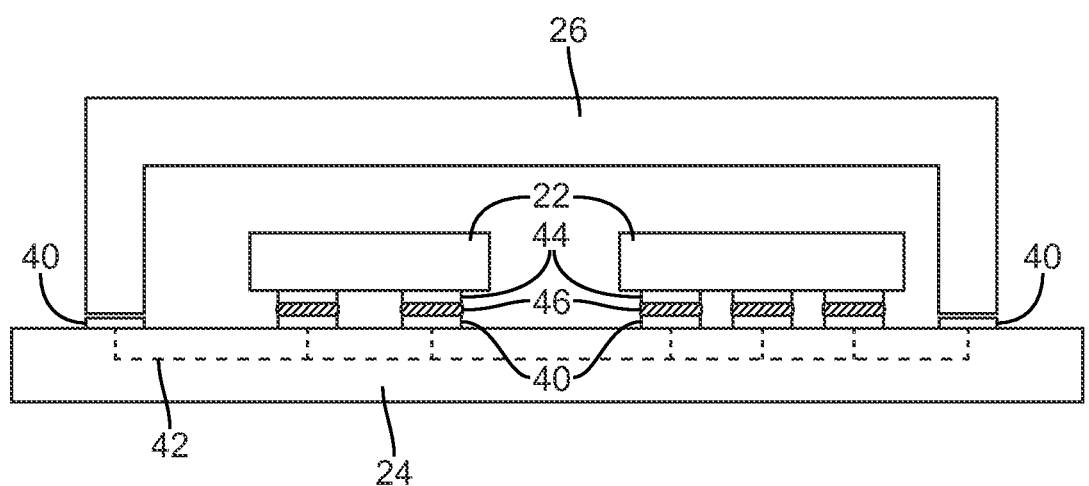
FIG. 3 is a cross-sectional side view of a portion of a printed circuit on which electronic components and an associated electromagnetic interference shielding can have been mounted in accordance with an embodiment.

A cross-sectional side view of shielding can 26 of FIG. 2 taken along line 38 and viewed in direction 36 is shown in FIG. 3. Electrical components 22 are mounted to printed circuit 24 using solder joints 46. Components 22 have contacts such as solder pads 44 formed from patterned metal traces. Printed circuit 24 has corresponding contacts such as solder pads 40 formed from patterned metal traces. Solder joints 46 may be formed between contacts such as solder pads 44 on components 22 and contacts such as solder pads 40 on printed circuit 24.

Figure 4:
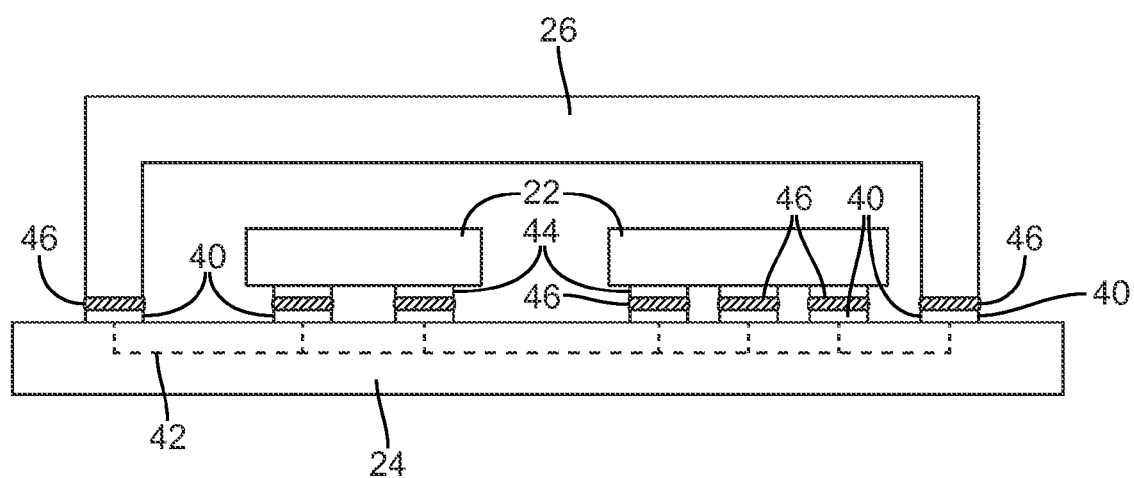
FIG. 4 is a cross-sectional side view of a printed circuit to which a shielding can has been soldered to electromagnetically shield electrical components on the printed circuit in accordance with an embodiment.

Printed circuit 24 includes metal traces 42. The metal traces of printed circuit 24 may include traces formed on the upper and/or lower surfaces of printed circuit 24 and/or internal traces. The traces on printed circuit 24 such as traces 42 are used in interconnecting components 22 and are therefore sometimes referred to as interconnects or interconnecting signal paths. Portions of the traces may form contact pads 40 to which frame 26 can be mounted (e.g., by using a screw or other fastener to apply a biasing force to shielding can 26 that presses shielding can 26 against pads 40). Traces 42 may include ground traces. If desired, the ground traces may be coupled to shielding can 26 using pads 40 that are in contact with shielding can 26. As shown in the illustrative configuration of FIG. 4, shielding can 26 may, if desired, be coupled to metal traces 42 using solder 46 that is interposed between portions of shielding can 26 and corresponding solder pads 40 on printed circuit 24.

Figure 5:
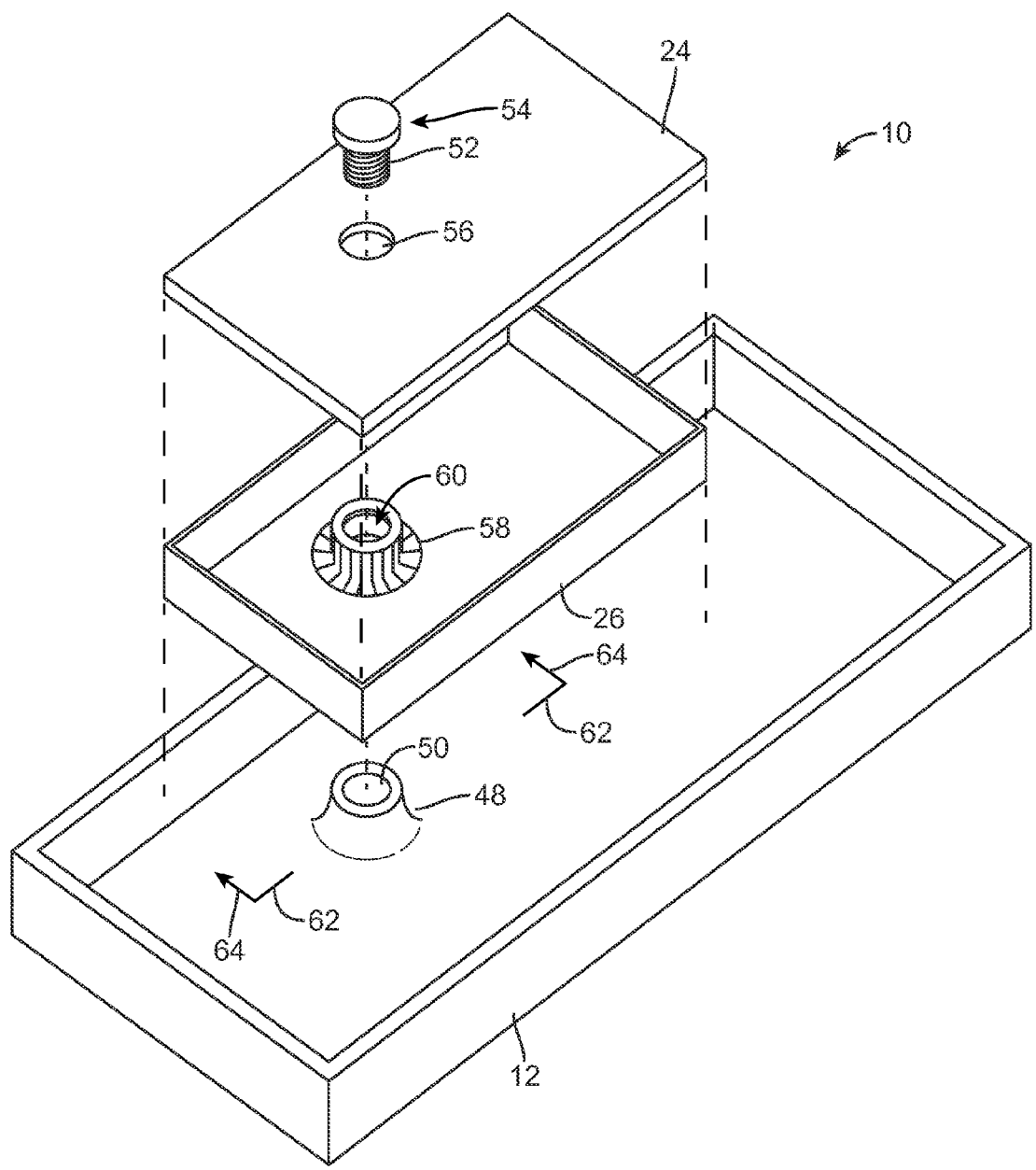
FIG. 5 is an exploded perspective view of an electromagnetic shielding can with a molded plastic structure that surrounds an opening in the shielding can and a printed circuit to which the electromagnetic shielding can is being mounted in accordance with an embodiment.

FIG. 5 is an exploded perspective view of an illustrative shielding can having an opening to accommodate a fastener such as a screw. Components 22 are mounted on the underside of printed circuit 24. Printed circuit 24 has opening 56 (sometimes referred to as a screw hole) through which threaded shaft 52 of screw 54 passes. Shaft 52 is received in threaded opening 50 of housing protrusion 48 in housing 12. Housing protrusion 48 (sometimes referred to as a screw boss, a metal member, metal structures, or housing structures) may be formed from an integral portion of housing 12 (e.g., an integral metal portion) or may be a separate structure that is attached to housing 12 using attachment structures such as welds, solder, adhesive, engagement features, fasteners such as screws, or other attachment mechanisms.

Shielding can 26 has an opening for receiving shaft 52 of screw 54. Conductive gasket 58 has opening 60. Opening 60 is aligned with the opening in shielding can 26. Opening 60 is also aligned with opening 56 in printed circuit 24 and opening 50 in housing protrusion 48, so that shaft 52 of screw 54 passes through opening 56 and opening 60 when screwing into opening 50 in screw boss 48. There is one screw 54 and one corresponding threaded housing structure such as screw boss 48 in device 10 of FIG. 5. This is, however, merely illustrative. There may be any suitable number of threaded openings 50 on housing 12 and a corresponding number of openings in shielding can 26 and printed circuit 24, if desired.

When screw 54 is screwed into opening 50, the head of screw 54 will bear down on printed circuit 24. This will press printed circuit 24 downwards towards housing 12. The edges of shielding can 26 will press against ground traces (contact pads 40) on printed circuit 24, as described in connection with FIG. 3. Conductive gasket 58 will help to fill any gaps between the conductive material of shielding can 26 and housing 12 (e.g., boss 48) that might otherwise arise, thereby helping to ensure that shielding can structure 26 serves as an effective electromagnetic interference shield.

Conductive gasket 58 may be formed from metal, plastic such as polycarbonate, an elastomeric polymer, an elastomeric polymer that has been filled with metal particles (e.g., copper particles or nickel particles), an elastomeric polymer that has been provided with other conductive filler material (e.g., nickel graphite powder) to ensure that gasket 58 exhibits a desired amount of conductivity, or other materials. Gasket 58 may, if desired, be formed from an elastomeric material such as silicone (e.g., silicone having a filler formed from conductive particles such as metal particles or other conductive particles to ensure that gasket 58 is conductive). The use of elastomeric materials for forming conductive structure 58 may help provide compliance when installing shielding can 26 within housing 12 of device 10. The use of a protruding shape for conductive elastomeric structure 58 may allow shielding can 26 to be mounted deep within the interior of housing 12, thereby consuming less height within housing 12.

Figure 6:
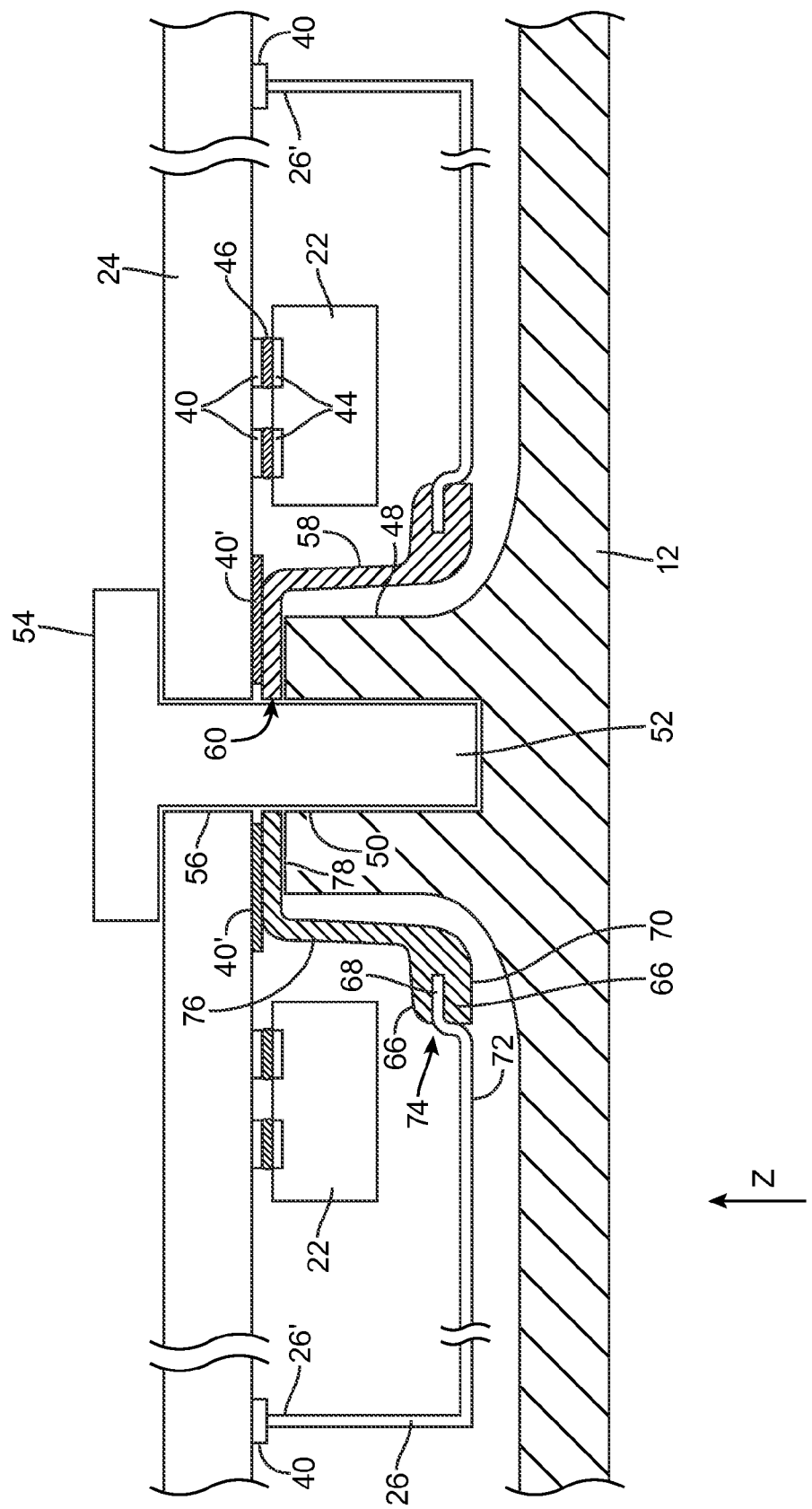
FIG. 6 is a cross-sectional side view of a portion of an electronic device having a shielding can and printed circuit of the type shown in FIG. 5 in accordance with an embodiment.

FIG. 6 is a cross-sectional side view of housing boss 48 and the other structures of FIG. 5 taken along line 62 and viewed in direction 64 (following assembly of the structures of FIG. 5). As shown in FIG. 6, housing boss 48 protrudes upwards in direction Z from the rest of housing 12. If desired, housing boss 48 may be formed from an internal housing member such as a standoff that is welded or otherwise attached to housing 12. Gasket 58 may include vertical sidewall portions such as sidewall portion 76 that extend parallel to housing boss 48 in direction Z to accommodate the mounting geometry for printed circuit board 24 that is shown in FIG. 6. With this arrangement, components 22 are attached using solder 46 that couples component contacts (solder pads 44) to respective contact pads 40 on printed circuit 24. Electrical components 22 are mounted upside down in the orientation of FIG. 6. Shielding can 26 is also mounted upside down. To ground shielding can 26, portions 26' of shielding can 26 are pressed against grounding contact pads 40 on printed circuit 24. If desired, solder may be used in coupling shielding can 26 to pads 40, as described in connection with FIG. 4.

Gasket 58 of FIG. 6 is formed from plastic that has been molded over inner edge 68 of the opening in the metal shielding can member forming shielding can structures 26 (e.g., by forming overmolded portions 66). Shielding can structures 26 have a bent sheet metal portion characterized by bend 74 surrounding housing boss 48. Bend 74 raises sheet metal portion 68 in direction Z, so that lower surface 70 of the lower portion of overmolded plastic 66 lies flush with lower surface 72 of shielding can 26. This allows shielding can structures 26 to be efficiently mounted within a potentially compact volume in the interior of electronic device housing 12.

Overmolded plastic portions 66 of gasket 58 form a lower horizontally extending ring-shaped lip that surrounds housing boss 48 and couples gasket 58 to the sheet metal layer in metal shielding can structures 26. Gasket 58 also has portions 78 that form an upper horizontally extending ring-shaped lip. Upper lip 78 is compressed between contact pad 40' on printed circuit 24 and the upper planar surface of housing boss 48 when screw 54 is screwed into housing boss 48 so that the threads of threaded shaft 52 mate with the threads of opening 50 in housing boss 48. Housing boss 48 is formed from metal in the FIG. 6 configuration, so the mounting configuration of FIG. 6 electrically couples (shorts) and thereby grounds housing 12, lip 78 of gasket 58, and contacts 40' on printed circuit 24. Ground traces 42 in printed circuit 24 may be used in grounding together the contact pads 40 that are coupled to shielding can 26 (including pads 40', if desired).

With the illustrative configuration of FIG. 6, no solder is needed to connect gasket lip portion 78 of gasket 76 to ground contact structures 40' on printed circuit 24, which saves height in dimension Z. Gasket 58 can be formed from an elastomeric material that provides compliance in aligning and mounting shielding can 26 relative to printed circuit 24 and housing 12. Shielding can structures 26 (e.g., the sheet metal structures other than gasket 58) may be formed from a relatively thin sheet metal part such as a stamped stainless steel sheet having a thickness of about 0.1 to 0.15 mm. It may be difficult or impossible to reliably bend an integral portion of this type of sheet metal to form the shape of gasket 48 that is shown in FIG. 6. The configuration of FIG. 6 therefore helps eliminate the need for thicker sheet metal in shielding can 26, saving additional height in dimension Z. Gasket 58 closes the potentially large electromagnetic interference opening that might otherwise be present between shielding can 26 and housing boss 48, thereby reducing electromagnetic signal leakage.

Figure 7:
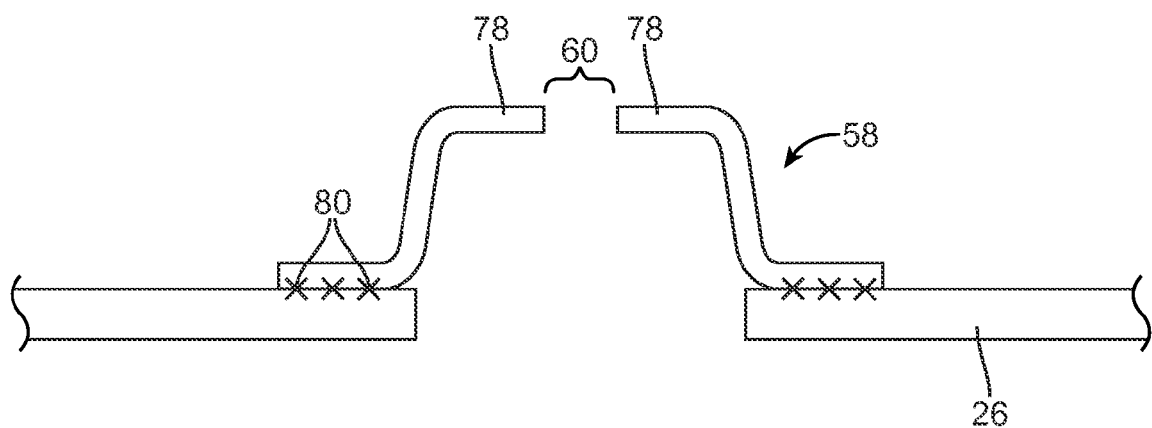
FIG. 7 is a cross-sectional side view of a portion of a shielding can having an opening and an attached conductive structure that surrounds the opening in accordance with an embodiment.

FIG. 7 is a cross-sectional view of a gasket configuration for shielding can structures 26 in which gasket 58 has been formed from a conductive member that is attached to shielding can structures 26 using attachment structures 80. Attachment structures 80 may be laser welds or welds formed using other welding equipment, may be conductive adhesive or other adhesive, may be fasteners such as screws, may be mechanical engagement features, or other attachment structures. With one suitable configuration, gasket 58 of FIG. 7 may be formed from the same type of metal as the sheet metal forming shielding can structures 26 (e.g., stainless steel).

Figure 8:
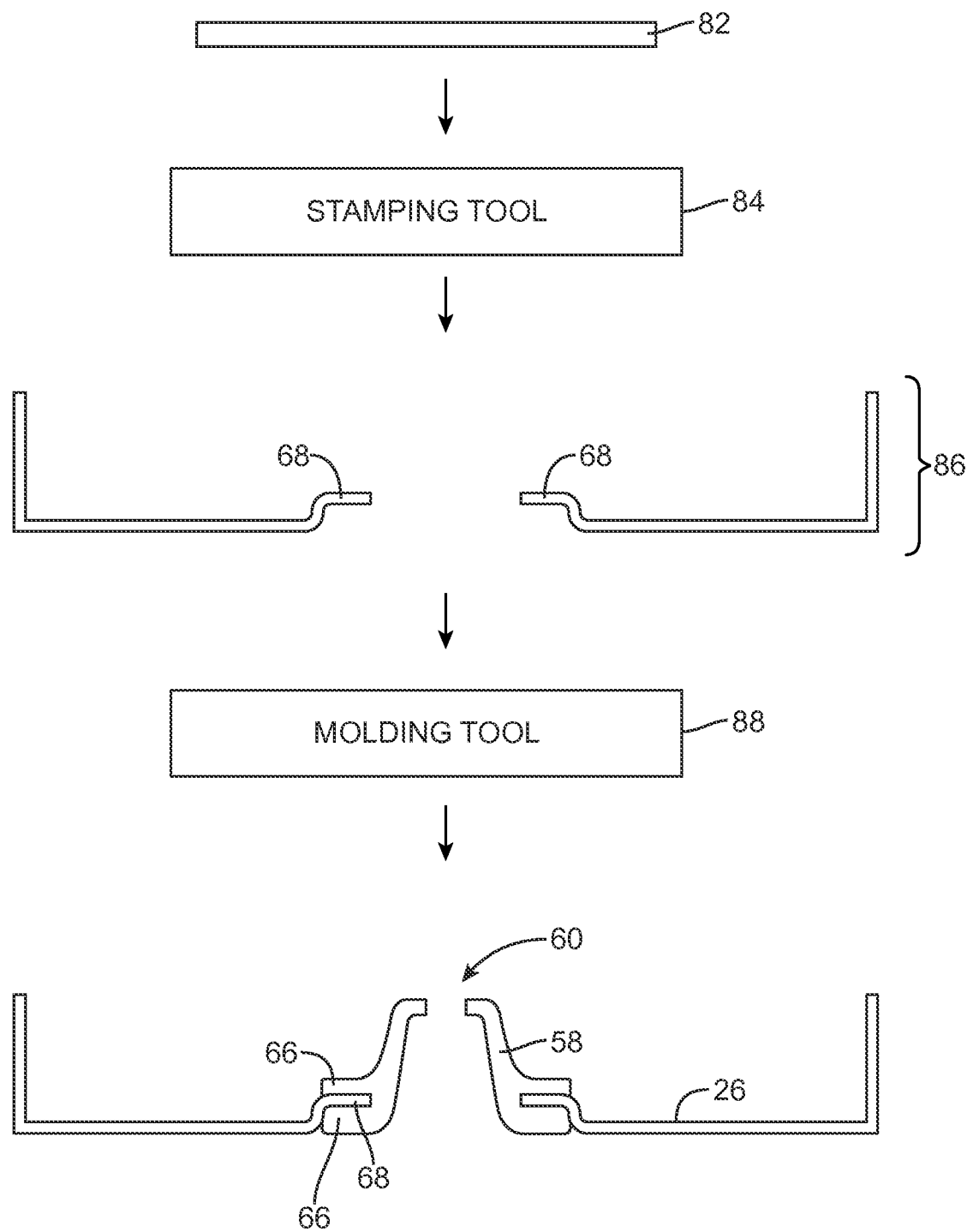
FIG. 8 is a diagram of equipment and operations involved in forming shielding can structures of the type shown in FIG. 5 in accordance with an embodiment.

FIG. 8 is a diagram of equipment and operations involved in forming shielding can structures 26 of FIG. 6. As shown in FIG. 8, fabrication equipment such as stamping tool 84 may process sheet metal 82 to form stamped shielding can structures 86 having lip portions 68 surrounding a screw hole and having peripheral vertical portions that form shielding can sidewalls. Molding tool 88 may then overmold conductive plastic onto sheet metal shielding can structures 86 over edge portion 68 of shielding can structures 86 to form gasket 58. Overmolded portions 66 help attach gasket 58 to sheet metal structures 86 of shielding can structures 26.

Figure 9:
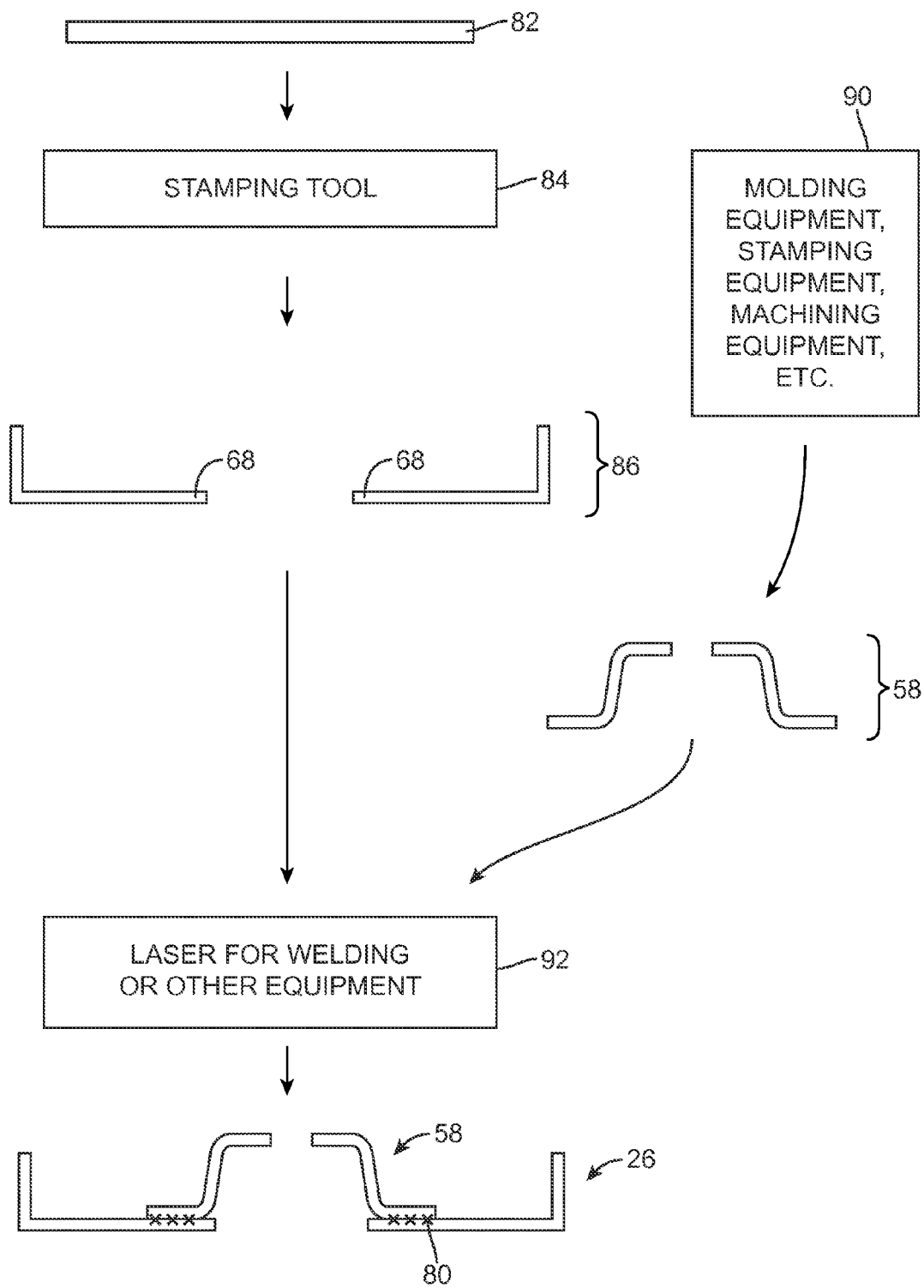
FIG. 9 is a diagram of equipment and operations involved in forming shielding can structures of the type shown in FIG. 7 in accordance with an embodiment.

FIG. 9 is a diagram of equipment and operations involved in forming shielding can structures 26 of FIG. 7. As shown in FIG. 9, fabrication equipment such as stamping tool 84 may process sheet metal 82 to form stamped shielding can structures 86 having edge portions 68 surrounding a screw hole and having peripheral vertical portions that form shielding can sidewalls. Edge portions 68 may lie flush with the planar surface of shielding can structures 26. Fabrication equipment 90 such as plastic molding equipment, machining equipment, metal stamping equipment, or other tools process sheet metal, conductive plastic, or other material to form conductive gasket 58.

Equipment 92 (e.g., laser welding equipment, adhesive application equipment, equipment that uses fasteners, or other equipment) may be used to attach gasket 58 to a metal shielding can member or other shielding can structures with attachment structures 80 (e.g., welds, adhesive, fasteners, engagement features, etc.).

Figure 10:
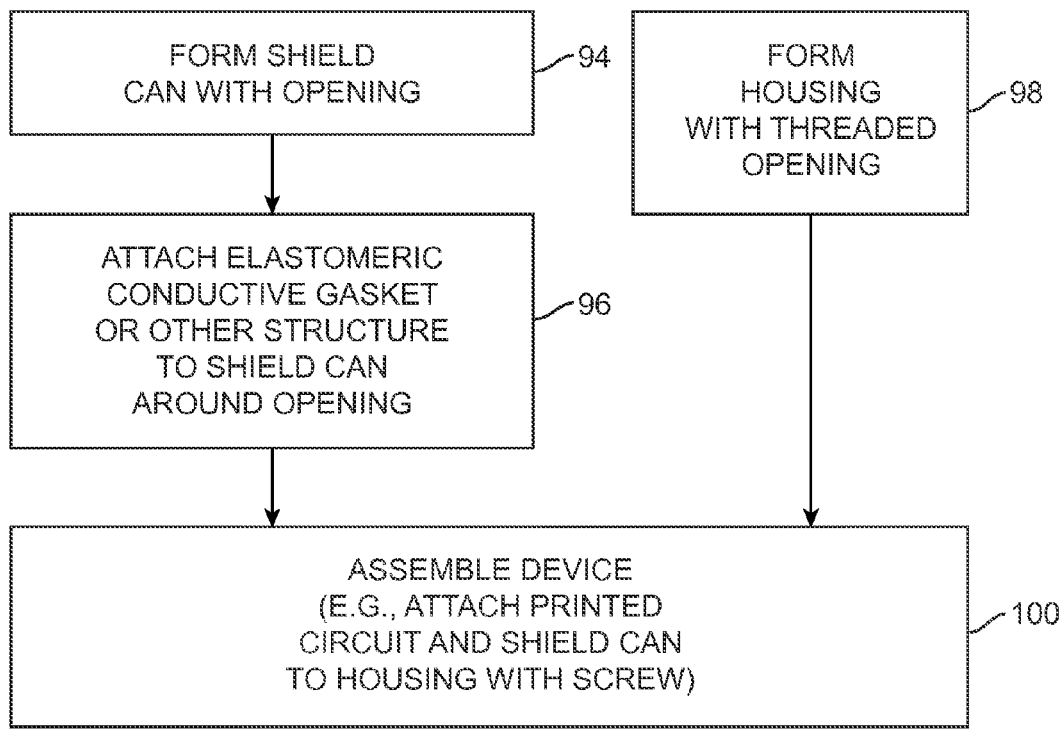
FIG. 10 is a flow chart of illustrative steps of forming an electronic device having a printed circuit with components that have been shielded using an electromagnetic interference shielding can in accordance with an embodiment.

A flow chart of illustrative steps involved in forming shielding can structures 26 with conductive gasket 58 is shown in FIG. 10. As shown in FIG. 10, shielding can structures with a screw hole opening (or multiple openings) are formed at step 94 (e.g., using stamping equipment to stamp a sheet metal layer into a desired shape, etc.).

At step 96, equipment such as plastic molding tool 88 of FIG. 8 or equipment 92 of FIG. 9 may be used in attaching gasket 58 to the stamped metal structures of shielding can structures 26. Gasket 58 may be an elastomeric conductive plastic gasket that is molded onto the sheet metal of shielding can structures 26, may be a metal structure that is laser welded to the sheet metal of shielding can structures 26, or may be other conductive structures that are attached to the sheet metal portions of shielding can structures 26 (e.g., using adhesive, fasteners, welds, solder, engagement features, etc.).

During the operations of step 98, machining equipment or other fabrication equipment may be used for form housing 12 with threaded opening 50 (e.g., threaded screw boss 48).

At step 100, printed circuit 24 with component 22 may be shielded by shielding can 26 by installing shielding can structures 26 and printed circuit 24 within housing 12 using a configuration of the type shown in FIG. 6 in which screw 54 mounts printed circuit 24 and shielding can structures 26 to housing boss 48. When mounting shielding can structures 26 in this way, screw 54 may press printed circuit 24 towards housing boss 48 while compressing lip 78 of gasket 58 between housing boss 48 and contacts 40' on printed circuit 24. This helps short contacts 40' and associated ground traces 42 in printed circuit 42, to gasket 58 and other portions of shielding can structures 26 and to housing 12, thereby grounding shielding can structures 26 so that shielding can structures 26 may effectively provide electromagnetic interference shielding. Computer-controlled equipment such as robotic assembly tools may be used in performing the component assembly operations of step 100 and/or manual assembly techniques may be used.

Figure 11:
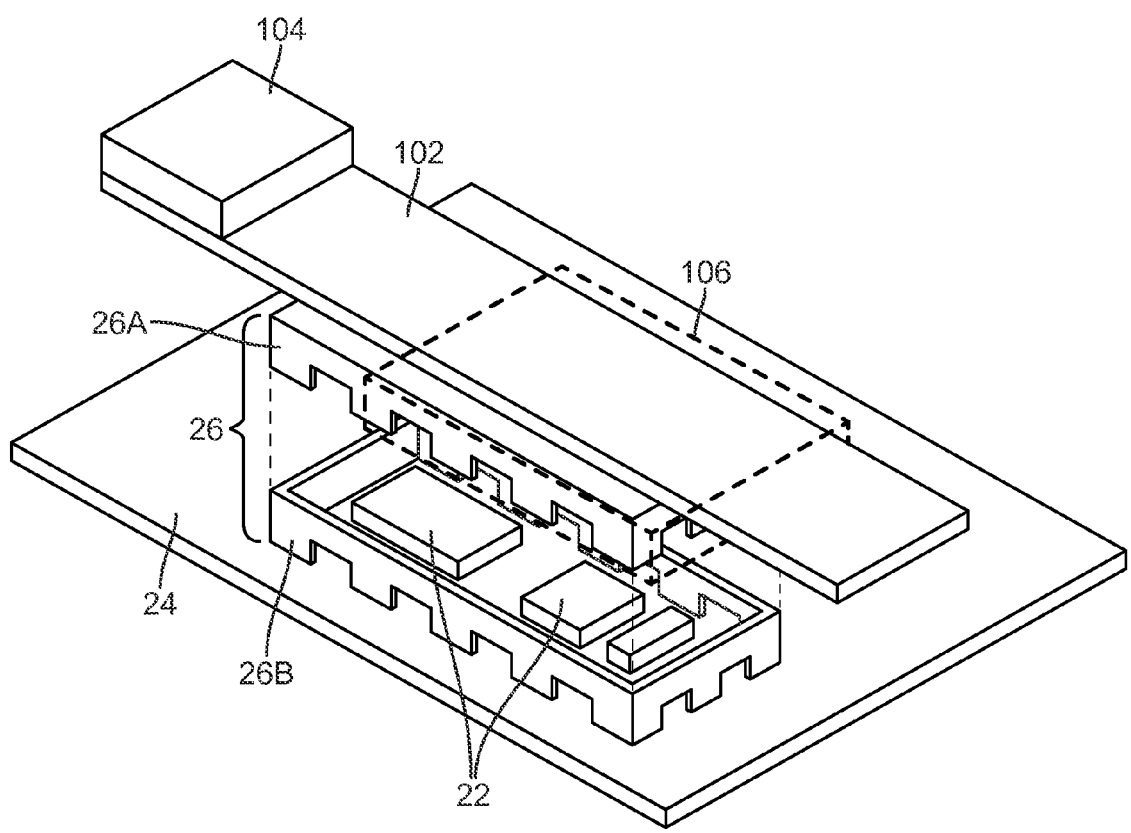
FIG. 11 is an exploded perspective view of an illustrative two-part shielding can structure to which a signal path such as a flexible printed circuit has been secured using molded plastic in accordance with an embodiment.

FIG. 11 is an exploded perspective view of shielding can structures that include a two-part shielding can. As shown in FIG. 11, shielding can 26 includes upper portion 26A and lower portion 26B. Upper portion 26A, which may sometimes be referred to as a lid or top, may have a planar upper surface and vertical peripheral sidewalls. The sidewalls may have notches as shown in FIG. 11. Lower portion 26B, which may sometimes be referred to as a fence or base, may have vertical sidewalls with notches (as an example). Components 22 such as integrated circuits and other electrical devices are mounted on printed circuit 24. Components 22 are provided with electromagnetic signal interference shielding by installing upper shielding can structure 24A on lower shielding can structure 26B to form shielding can 26.

Device 10 includes signal paths for coupling electrical components together. As an example, a signal path may be formed from a flexible printed circuit such as flexible printed circuit cable 102 of FIG. 11. Flexible printed circuit cable 102 may be used to carry signals for a component such as electronic component 104. Component 104 may be a connector that is mounted in connector port 20 of FIG. 1. With this type of arrangement, signal lines in printed circuit cable 102 couple control circuitry within device 10 to connector 104. The signal lines may include data lines, power lines, analog signal lines, and ground lines (e.g., power and/or data ground lines).

To ensure satisfactory grounding of component 104, it may be desirable to short the ground conductors in cable 102 to shielding can portion 26A. As shown in FIG. 11, this may be accomplished by running cable 102 across the top surface of shielding can portion 26A. Exposed ground traces on the lower surface of cable 102 are shorted to the top of shielding can portion 26A so that connector 104 is grounded to shielding can 26. Unlike conventional schemes that short flexible printed circuit ground traces to shielding cans using conductive adhesive that may warp and peel over time, the configuration of FIG. 11 uses overmolded plastic 106 to attach flexible printed circuit 102 to shielding can 26. With this approach, cable 102 and shielding can portion (lid) 26A are embedded within overmolded plastic 106 so that the overmolded plastic covers at least some of cable 102 and at least some of shielding can lid 26A.

Overmolded plastic 106 may, for example, hold conductive ground traces on flexible printed circuit 102 against the exposed upper surface of metal shielding can structures such as metal shielding can portion 26A (i.e., shielding can lid 26A may be embedded within conductive plastic 106 so that some of the conductive plastic lies above the upper surface of lid 26A and so that some of the conductive plastic lies below the opposing lower surface of lid 26A). Plastic 106 may be formed from an elastomeric material such as silicone or other types of plastic (polycarbonate, etc.). Conductive additives (e.g., metal particles of copper or nickel, nickel graphite powder, etc.) may be incorporated into plastic 106 to enhance the electrical and/or thermal conductivity of plastic 106, thereby enhancing the ability of plastic 106 to assist in providing electromagnetic signal shielding, signal grounding, and heat dissipation.

Plastic 106 attaches flexible printed circuit 102 (e.g., a flexible printed circuit cable with exposed ground traces) to upper shielding can portion 26A. After plastic 106 has been molded around flexible printed circuit 102 and upper metal shielding can structures 26A, upper shielding metal can structures 26A may be attached to lower metal shielding can structures such as lower shielding can portion 26B to form shielding can 26 over components 22 on printed circuit 24.

Figure 12:
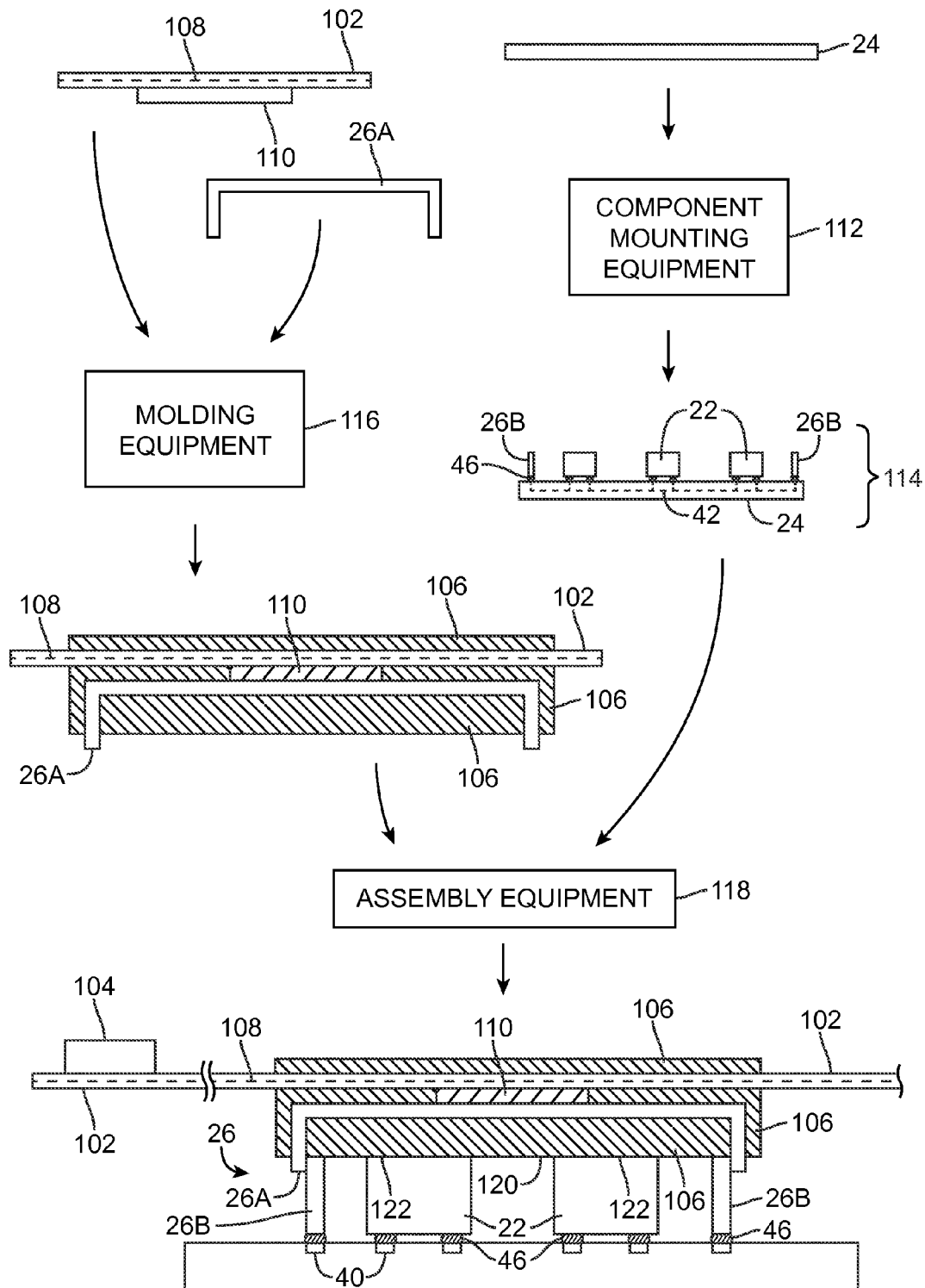
FIG. 12 is a diagram of equipment and operations involved in forming a shielding can structure that shields electronic components on a printed circuit and that has molded plastic to provide a thermal pathway that allows heat to be conducted away from the electronic components in accordance with an embodiment.

FIG. 12 is a diagram of equipment and operations involved in forming shielding can structures of the type shown in FIG. 11. As shown in FIG. 12, flexible printed circuit 102 is formed from a layer of polymer having metal traces 108 including exposed ground traces 110 on the lower surface of flexible printed circuit 102. Flexible printed circuit 102 may be placed in contact with upper shielding can portion 26A so that metal traces 110 contact the upper surface of shielding can structures 26A. Molding equipment 116 may then mold plastic 106 around flexible printed circuit 102 and upper shielding can structures 26A, thereby securing flexible printed circuit 102 to upper shielding can metal structures 26A.

Component mounting equipment 112 mounts structures on printed circuit 24 such as components 22 and lower shielding can metal structures 26B. Component mounting equipment 112 may include equipment for soldering components 22 and lower shielding can portion 26B to contacts on the surface of printed circuit 24. For example, component mounting equipment 112 may include pick-and-place equipment and reflow oven equipment for forming solder joints 46.

Assembly equipment 118 may include computer-controlled positioners and other tools for assembling device components. Using assembly equipment 118, upper shielding can portion 26A, flexible printed circuit 102, and overmolded plastic 106 may be attached to lower shielding can portion 26B to form shielding can structures 26. Components such as connector 104 may be attached to flexible printed circuit 102 before or after assembly of shielding can structures 26 using equipment 118.

As shown in the lower portion of FIG. 12, plastic 106 has lower inner surface 120. Lower inner surface 120 is preferably configured to rest against upper surfaces 112 of components 22. When plastic 106 contacts components 22 in this way, heat that is generated by components 22 during operation is transferred away from components 22 through plastic 106. Plastic 106 therefore forms part of a thermal conduction path that dissipates excess heat from components 22. Heat flows from components 22 through plastic 106 and through shielding can structures 26 and the other structures of FIG. 12 to be dissipated into the environment surrounding shielding can structures 26. If desired, supplemental heat sinking structures (e.g., metal fins that are formed as part of shielding can structures 26 or separate structures) may help dissipate heat.

Figure 13:
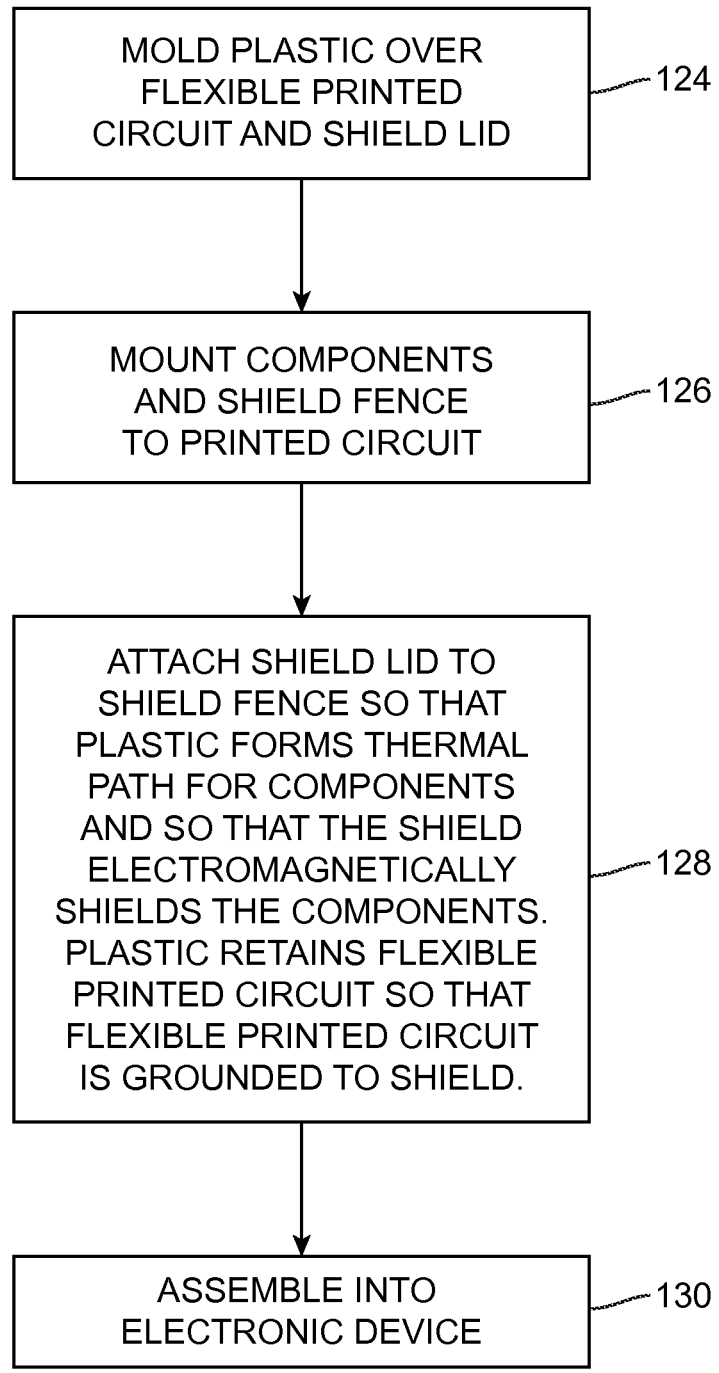
FIG. 13 is a flow chart of illustrative steps involved in forming electronic device structures in which electrical components are mounted to a printed circuit and covered using electromagnetic shielding structures having a two-part configuration of the type shown in FIG. 11 in accordance with an embodiment.

FIG. 13 is a flow chart of illustrative steps involved in forming electronic devices with shielding can structures such as the shielding can structures of FIG. 12.

At step 124, molding equipment 116 molds plastic 106 over upper shielding can structures 26A (e.g., a shield can lid) and signal path structures such as wires, cables, etc. In the illustrative configuration of FIG. 12, molding equipment 116 has molded plastic 106 over flexible printed circuit 102, so that flexible printed circuit traces such as exposed ground traces 110 contact the exposed conductive metal surface of upper metal shielding can structures 26A.

At step 126, component mounting equipment 112 mounts components 22 and lower shielding can metal structures 26B to printed circuit 24. Printed circuit 24 may be a flexible printed circuit formed from a layer of polyimide or other sheet of flexible polymer or may be a rigid printed circuit board formed from a layer of fiberglass-filled epoxy or other rigid printed circuit board material. If desired, components 22 and lower shielding can structures 26B may be mounted on other substrates such as molded plastic parts, glass substrates, and ceramic substrates.

At step 128, assembly equipment 118 forms shielding can structures 26 by attaching upper shielding can structures 26A (e.g., a shield can lid) to lower shielding can structures 26B (e.g., a shield fence or other shielding can structures to which a shielding can lid may be attached). Plastic 106 is preferably configured so that lower surface 120 of plastic 106 contacts upper surfaces 122 of components 22 to provide a thermal path that dissipates heat from components 22 during operation of device 10. Plastic 106 is molded over the signal path structure formed from flexible printed circuit 102 to retain flexible printed circuit 102 in place on shielding can 26. The placement of flexible printed circuit 102 on upper shielding can structures 26A shorts the traces in conductive paths 108 of flexible printed circuit 102 to shielding can structures 26.

At step 130, assembly equipment (e.g., assembly equipment 118 or other computer-controlled equipment) and/or manual assembly techniques may be used in mounting shielding can structures 26 and the structures attached to shielding can structures 26 such as flexible printed circuit 102 and printed circuit 24 to other device components (e.g., housing 12, display 14, etc.), thereby forming device 10.

Figure 14:
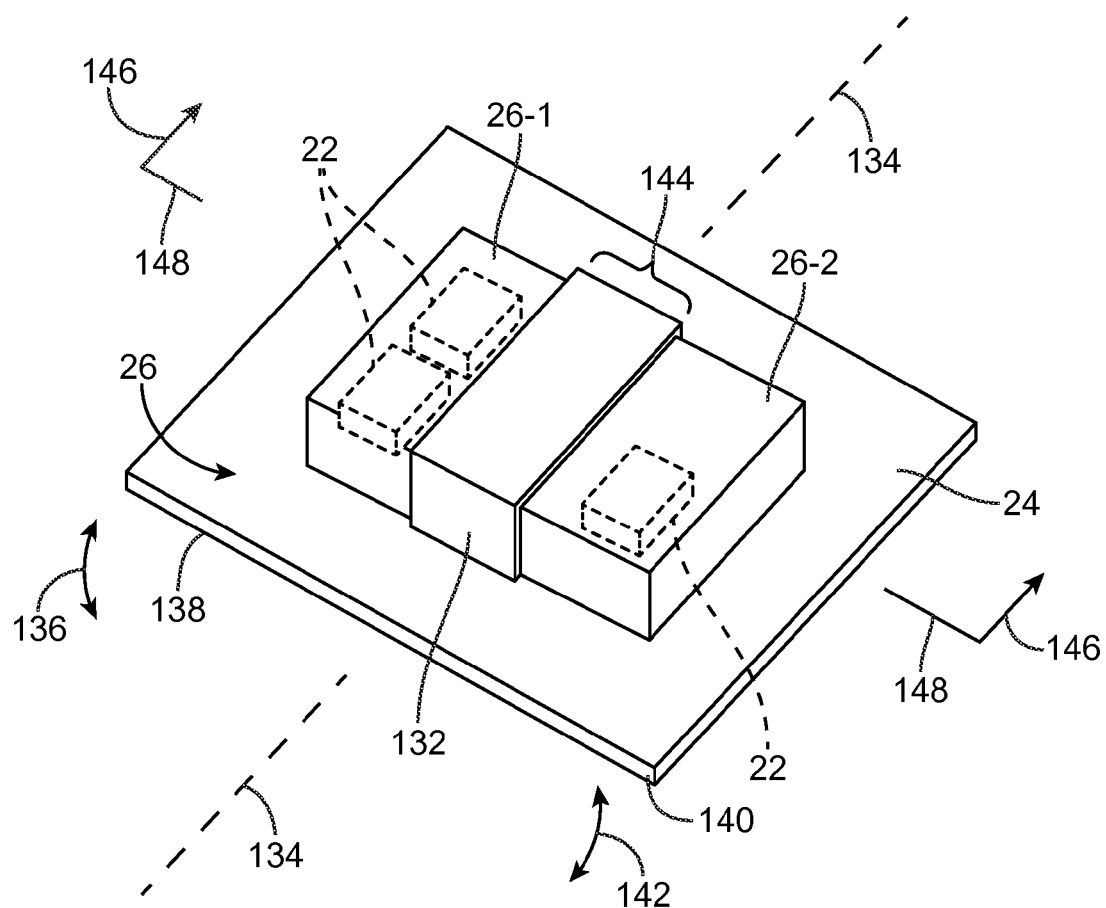
FIG. 14 is a perspective view of electromagnetic interference shielding can structures having two shielding can portions that have been joined using a material such as a molded conductive elastomeric plastic material in accordance with an embodiment.

If desired, shielding can structures can be formed using metal parts such as stamped sheet metal members that are joined using conductive bridging structures. This type of arrangement is shown in FIG. 14. As shown in FIG. 14, shielding can 26 includes multiple shielding can metal structures such as metal shielding can structures 26-1 and metal shielding can structures 26-2 that are bridged by bridging structures such as bridging structures 132. In the example of FIG. 14, there are two metal shielding can structures (26-1 and 26-2) and a single bridging member (bridging member 132). This is merely illustrative. Shielding can structures 26 may include two or more metal shielding can structures, three or more metal shielding can structures, or four or more metal shielding can structures. There may be one or more bridging members coupled between the metal shielding can structures. The arrangement of FIG. 14 in which there are two metal shielding can structures and a single bridging member is merely illustrative.

Metal shielding can structures 26-1 and 26-2 may each be formed from a unitary metal member (e.g., a stamped sheet metal member) or may each be formed from multiple parts (e.g., a lower shielding can structure such as a frame structure or other base and an upper shielding can structure such as a lid). Metal shielding can structures 26-1 and 26-2 may be metal shielding can members formed from stamped metal that are separated by gaps such as gap 144 of FIG. 14. Bridging structures 132 may be coupled between the metal shielding can members across the gap (i.e., bridging structures 132 may span (bridge) the gap between the metal shielding can members). Bridging structures 132 are preferably formed from conductive material such as elastomeric polymer material with conductive filler, flexible structures that include a layer of metal, metal structures (e.g., flexible metal structures), or other conductive structures. Substrate 24 may be bent along bend axis 134. Metal shielding can structures 26-1 and 26-2 may be located on opposing sides of the bend in substrate 24. Bridging structures 132 may overlap the bend.

Shielding can structures 26 may form an electromagnetic interference shield that shields electrical components 22 that are mounted within the interior of shielding can structures 26 on substrate 24. Substrate 24 may be a flexible printed circuit, a rigid printed circuit board, a molded plastic carrier, a glass member, a ceramic structure, or other dielectric substrate. Particularly in configurations in which substrate 24 is formed from a flexible structure such as a flexible printed circuit, it may be desirable to form bridging structures 132 from flexible materials. The use of flexible material in forming bridging structures 132 allows shielding can structures 26 to be bent (e.g., to accommodate mounting on a non-planar substrate that is supported by a non-planar support structure, to help configure shielding can 26 for mounting within the potentially tight confines of an interior space within housing 12, etc.).

In the example of FIG. 14, the presence of flexible conductive bridging structures 132 allow shielding can 26 to flex along bend axis 134 when edge 138 of substrate 24 is moved in directions 136 and/or when opposing edge 140 of substrate 24 is moved in directions 142.

Figure 15:
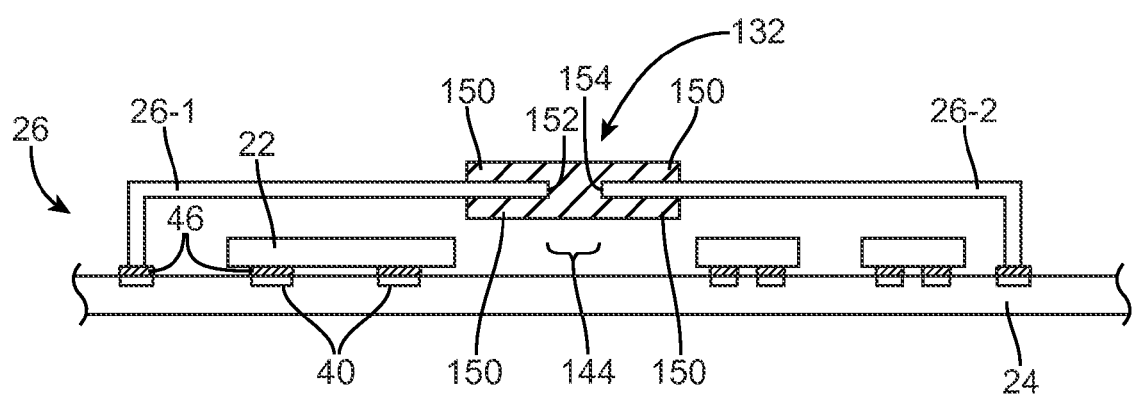
FIG. 15 is a cross-sectional side view of a printed circuit to which electrical components have been mounted that are covered by a multi-part electromagnetic interference shielding can with portions joined using a plastic molded structure in accordance with an embodiment.

FIG. 15 is a cross-sectional side view of the shielding can structures of FIG. 14 taken along line 148 and viewed in direction 146. Components 22 and metal shielding can structures 26-1 and 26-2 (or parts of structures 26-1 and 26-2 in configurations in which structures 26-1 and 26-2 are formed from lower and upper portions) are mounted to substrate 24 using solder 46. As shown in FIG. 15, bridging structures 132 may include portions 150 that extend over opposing edges 152 and 154 of respective metal shielding can structures 26-1 and 26-2. Bridging structures 132 may be molded into place using molding equipment or may be attached to metal shielding can structures 26-1 and 26-2 by inserting edges 152 and 154 into slots or other openings formed between portions 150 of bridging structures 132. If desired, adhesive, fasteners, or other structures may be used in attaching bridging structures 132 to metal shielding can structures.

Figure 16:
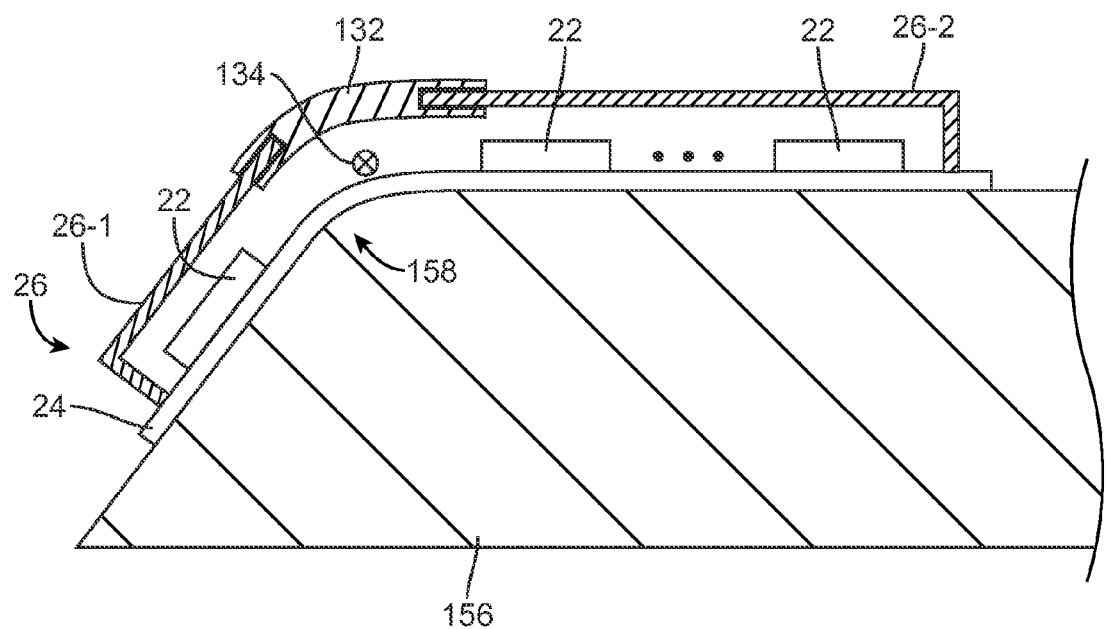
FIG. 16 is a cross-sectional side view of shielding can structures of the type shown in FIG. 15 that have been mounted on a non-planar surface such as a curved surface of a speaker box or other supporting structure in accordance with an embodiment.
Figure 17:
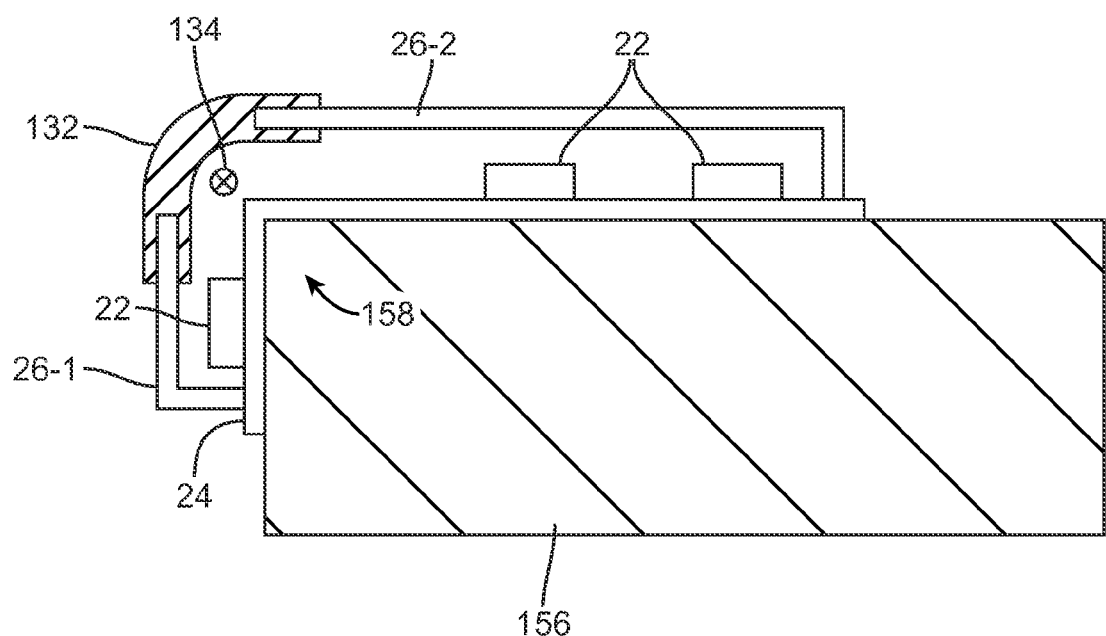
FIG. 17 is a cross-sectional side view of a shielding can structure of the type shown in FIG. 15 that has been mounted so that the shielding can structure overlaps a right-angle bend in the surface of a supporting structure in an electronic device in accordance with an embodiment.

As shown in FIG. 16, substrate 24 may be mounted on a curved support structure such as support structure 156. Support structures 156 may be formed from materials such as plastic or metal. As an example, support structures 156 may form all or part of a component such as a plastic speaker box. Substrate 24 may be bent along curved outer surface 158. Bridging structures 132 may be formed from a flexible material such as a conductive elastomeric material (e.g., silicone or other elastomeric polymer material with conductive filler). This allows bridging structures 132 (which may sometimes also be referred to as conductive elastomeric structures or flexible conductive structures) to bend about bend axis 134. As shown in the illustrative configuration of FIG. 17, surface 158 may contain a right-angle bend. Substrate 24 and bridging structures 132 may be bent at a right angle about bend axis 134 so that substrate 24 and shielding can structures 26 accommodate the right angle bend formed on surface 158 of non-planar support structures 156.

Figure 18:
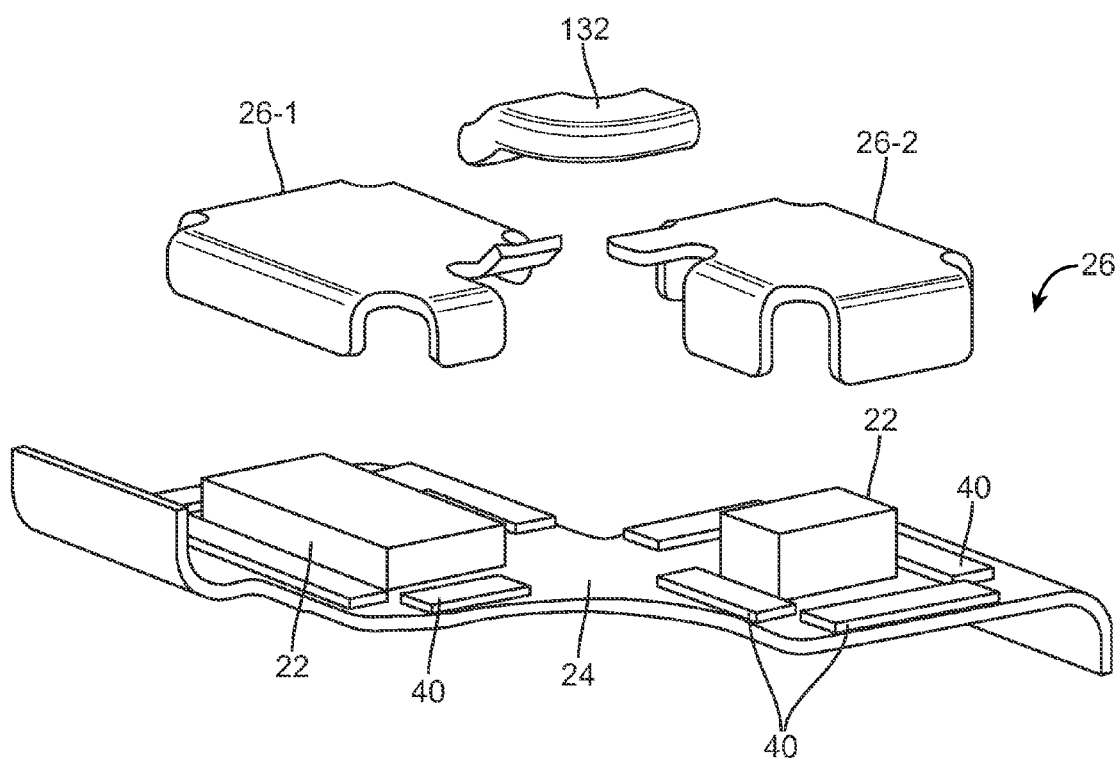
FIG. 18 is an exploded perspective view of an illustrative multi-part shielding can structure that has a conductive bridging structure formed from a material such as a conductive elastomeric material in accordance with an embodiment.

FIG. 18 is an exploded perspective view of shielding can structures formed from metal shielding can structures 26-1 and 26-2 that are bridged using conductive elastomeric bridging structures 132. As shown in FIG. 18, printed circuit substrate 24 includes metal traces 30 (e.g., traces for forming grounding contact pads for shielding can structures 26 such as metal shielding can structure 26-1 and metal shielding can structure 26-2). Printed circuit substrate 24 may be formed from a flexible printed circuit substrate material to allow substrate 24 and shielding can structures 26 to be bent, described in connection with FIGS. 16 and 17.

Figure 19:
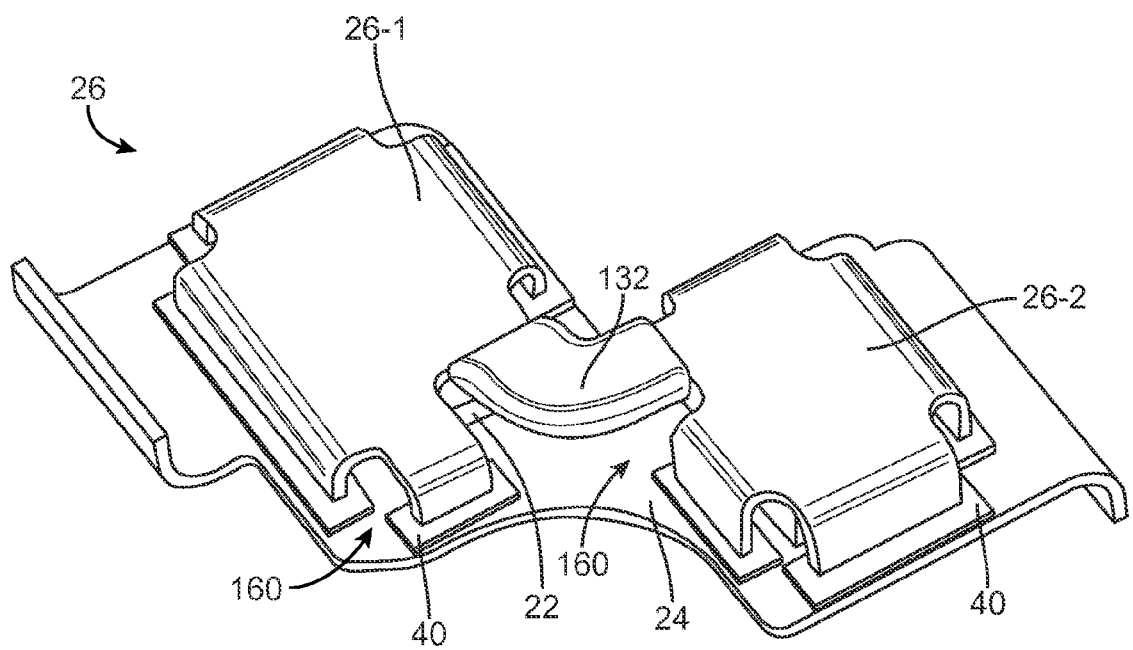
FIG. 19 is a perspective view of multi-part shielding can structures of the type shown in FIG. 18 in accordance with an embodiment.

A perspective view of shielding can structures 26 of FIG. 18 following attachment of metal shielding can structures 26-1 and 26-2 to substrate 24 is shown in FIG. 19. As shown in FIG. 19 shielding can structures 26 may have openings such as openings 160 (e.g., openings between sidewall portions of structures 26, openings under bridging structures 132 and between bridging structures 132 and metal shielding can structures 26-1 and 26-2, etc.). For effective electromagnetic shielding, it may be desirable to restrict the maximum lateral dimensions of these openings. For example, the maximum size of the gaps in shielding structures 26 may be less than one tenth of a wavelength at electromagnetic interference frequencies of interest (as an example).

Figure 20:
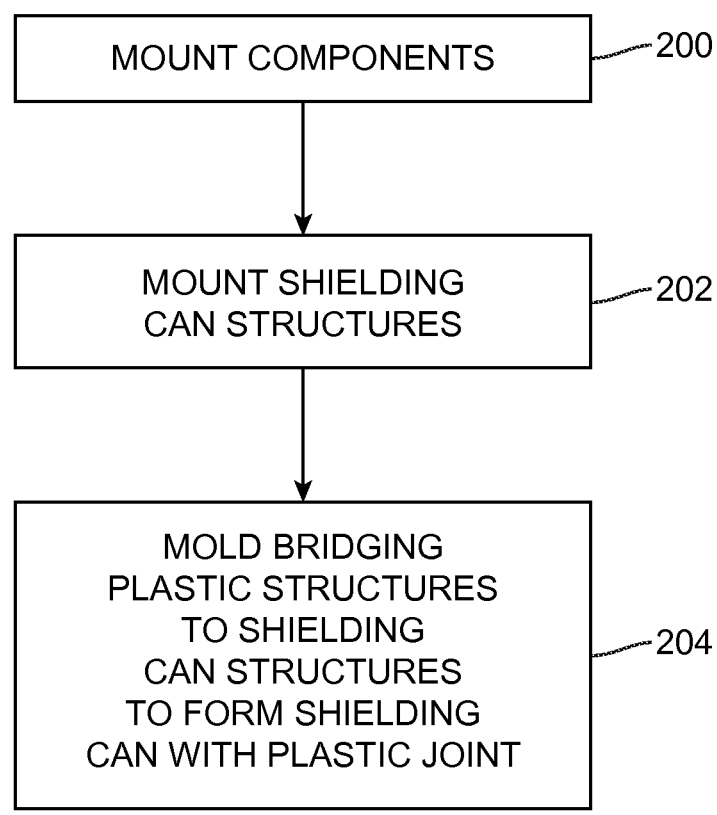
FIG. 20 is a flow chart of illustrative steps involved in forming electromagnetic shielding structures from multiple parts joined by a conductive bridging structure in accordance with an embodiment.

Illustrative steps involved in forming shielding can structures of the type described in connection with FIGS. 14-19 are shown in FIG. 20. As step 200, component mounting equipment (e.g., pick-and-place equipment, solder reflow oven equipment, etc.) can be used to mount electrical components on a substrate such as flexible printed circuit substrate 24. Metal shielding can structures 26-1 and 26-2 may also be mounted to substrate 24 during the operations of step 200 or metal shielding can structures 26-1 and 26-2 may be mounted to substrate 24 at step 202, following the mounting of components 22 to substrate 24 at step 200.

Bridging structures 132 may be coupled between metal shielding can structures 26-1 and 26-2 before or after metal shielding can structures 26-1 and 26-2 are mounted on substrate 24. If desired, bridging structures 132 may be formed from conductive elastomeric material such as silicone or other elastomeric plastic with conductive filler. In this type of scenario, bridging structures 132 may, during the operations of step 204, be molded onto metal shielding can structures 26-1 and 26-2 using plastic molding equipment or may be attached to metal shielding can structures 26-1 and 26-2 by inserting the edges of the metal shielding can structures into slits in the ends of the bridging structures (as examples). If desired, bridging structures 132 may also be coupled to metal shielding can structures using adhesive (e.g., conductive adhesive), screws or other fasteners, springs or other engagement structures, or other attachment structures.

The foregoing is merely illustrative and various modifications can be made by those skilled in the art without departing from the scope and spirit of the described embodiments. The foregoing embodiments may be implemented individually or in any combination.

What is claimed is:

1. Apparatus, comprising:
   a substrate;
   electrical components mounted on the substrate; and
   shielding can structures that cover the electrical components, wherein the shielding can structures include metal structures and conductive elastomeric structures, wherein the conductive elastomeric structures have an opening, wherein the metal shielding can structures have an opening, and wherein the opening in the conductive elastomeric structures is aligned with the opening in the metal structures.

2. The apparatus defined in claim 1 wherein the substrate has an opening that is aligned with the opening in the conductive elastomeric structures and the opening in the metal structures.

3. The apparatus defined in claim 2 further comprising a screw having a shaft that passes through the opening in the substrate, the opening in the conductive elastomeric structures, and the opening in the metal structures.

4. The apparatus defined in claim 3 further comprising electronic device housing structures with a threaded opening that receives the shaft.

5. The apparatus defined in claim 4 wherein the conductive elastomeric structures have a lip that is compressed between the substrate and the electronic device housing structures.

6. The apparatus defined in claim 5 wherein the substrate comprises a printed circuit with metal traces and wherein the lip is shorted to the metal traces.

7. The apparatus defined in claim 6 wherein the electronic device housing structures comprise a screw boss in which the threaded opening is formed.

8. The apparatus defined in claim 1 wherein the conductive elastomeric structures comprise a ring-shaped gasket formed from an elastomeric polymer with a conductive filler.

9. The apparatus defined in claim 1 wherein the metal structures comprise:
a first metal shielding can member; and
a second metal shielding can member.

10. The apparatus defined in claim 1 wherein the metal structures comprise lower shielding can structures and upper shielding can structures, wherein the conductive elastomeric structures comprises plastic with conductive filler, and wherein the plastic is molded over the upper shielding can structure.

11. The apparatus defined in claim 10 further comprising a flexible printed circuit having a ground trace that is shorted to the upper shielding can structure, wherein the plastic is molded over the flexible printed circuit.

12. The apparatus defined in claim 11 wherein the plastic has a lower surface that is configured to contact upper surfaces of the electrical components.

13. The apparatus defined in claim 12 further comprising an electronic component mounted to the flexible printed circuit.

14. The apparatus defined in claim 13 wherein the electronic component mounted to the flexible printed circuit comprises a connector.

15. The apparatus defined in claim 14 wherein the lower shielding can structures comprise a metal shielding can base and wherein the upper shielding can structures comprise a shielding can lid that is mounted to the metal shielding can base.

16. Apparatus, comprising:
a substrate;
electrical components mounted on the substrate; and
shielding can structures that cover the electrical components, wherein the shielding can structures include metal structures and conductive elastomeric structures, and wherein the metal structures comprise:
a first metal shielding can member; and
a second metal shielding can member, wherein the first metal shielding can member and the second metal shielding can member are separated by a gap and wherein the conductive elastomeric structures comprise bridging structures that are coupled between the first metal shielding can member and the second metal shielding can member across the gap.

17. The apparatus defined in claim 16 further comprising a support structure having a non-planar surface with a bend, wherein the substrate is supported on the support structure so that the first and second metal shielding can members lie on opposing sides of the bend and wherein the conductive elastomeric structure overlaps the bend.

18. Apparatus, comprising:
an electronic device housing having a protrusion;
a printed circuit board;
electrical components mounted on the printed circuit board; and
shielding can structures that shield the electrical components from electromagnetic interference and that have a metal gasket with an opening, wherein the metal gasket has a lip that lies between the protrusion and the printed circuit board.

19. The apparatus defined in claim 18 wherein the printed circuit board includes metal traces and wherein the lip contacts the metal traces.

20. The apparatus defined in claim 19 wherein the protrusion comprises a screw boss, the apparatus further comprising as screw that screws into the screw boss and attaches the printed circuit board and the shielding can structures to the electronic device housing.

21. The apparatus defined in claim 18 wherein the shielding can structures comprise sheet metal and wherein the metal gasket is welded to the sheet metal.

22. Apparatus, comprising:
a substrate;
electrical components mounted on the substrate, wherein the electrical components have upper surfaces;
plastic with a conductive filler, wherein the plastic contacts the upper surfaces; and
a shielding can lid embedded within the plastic.

23. The apparatus defined in claim 22 further comprising:
a flexible printed circuit embedded within the plastic, wherein the flexible printed circuit has metal traces that contact the shielding can lid.

24. The apparatus defined in claim 23 further comprising:
a shielding can base to which the shielding can lid is attached.

25. The apparatus defined in claim 23 further comprising a connector mounted on the flexible printed circuit.

26. The apparatus defined in claim 25 wherein the substrate comprises a rigid printed circuit board.

27. Apparatus, comprising:
a substrate having a bend;
electrical components mounted on the substrate; and
shielding can structures having first and second shielding can members that are separated by a gap and that are located on opposing sides of the bend and having conductive elastomeric bridging structures that span the gap and overlap the bend.

28. The apparatus defined in claim 27 wherein the substrate comprises a flexible printed circuit.

29. The apparatus defined in claim 28 wherein the flexible printed circuit comprises metal traces and wherein the first and second shielding can members are mounted on the metal traces.

30. The apparatus defined in claim 29 further comprising a support structure with a non-planar surface, wherein the substrate is mounted to the non-planar surface.

31. The apparatus defined in claim 30 wherein the support structure comprises a speaker box.

32. The apparatus defined in claim 27, wherein the conductive elastomeric bridging structures are coupled between the first shielding can member and the second shielding can member.

* * * * *